United States Patent
Kim

(10) Patent No.: US 9,627,847 B2
(45) Date of Patent: Apr. 18, 2017

(54) WAVELENGTH-TUNABLE LASER

(71) Applicant: PHOVEL. CO. LTD, Daejeon (KR)

(72) Inventor: Jeong Soo Kim, Gongju (KR)

(73) Assignee: PHOVEL.CO.LTD., Daejeon (KR)

( * ) Notice: Subject to any disclaimer, the term of this patent is extended or adjusted under 35 U.S.C. 154(b) by 1 day.

(21) Appl. No.: 14/781,978

(22) PCT Filed: Apr. 7, 2014

(86) PCT No.: PCT/KR2014/002979
§ 371 (c)(1),
(2) Date: Oct. 2, 2015

(87) PCT Pub. No.: WO2014/163449
PCT Pub. Date: Oct. 9, 2014

(65) Prior Publication Data
US 2016/0056608 A1    Feb. 25, 2016

(30) Foreign Application Priority Data

Apr. 5, 2013  (KR) .................. 10-2013-0037229
Apr. 22, 2013 (KR) .................. 10-2013-0044221

(51) Int. Cl.
*H01S 3/10*     (2006.01)
*H01S 5/024*    (2006.01)
(Continued)

(52) U.S. Cl.
CPC .......... *H01S 5/02446* (2013.01); *H01S 5/005* (2013.01); *H01S 5/02438* (2013.01);
(Continued)

(58) Field of Classification Search
CPC ........ H01S 5/141; H01S 5/14; H01S 5/02446; H01S 5/0687; H01S 5/02212;
(Continued)

(56) References Cited

U.S. PATENT DOCUMENTS

2002/0159683 A1* 10/2002 Helin ................... G02B 6/3584
                                                            385/18
2003/0012925 A1*  1/2003 Gorrell ............. H01L 21/30608
                                                           428/137

(Continued)

FOREIGN PATENT DOCUMENTS

KR    10-0859713 B1   9/2008
KR    10-0871011 B1   11/2008
(Continued)

OTHER PUBLICATIONS

International Search Report for PCT/KR2014/002979 filed Jun. 26, 2014.

*Primary Examiner* — Kinam Park
(74) *Attorney, Agent, or Firm* — STIP Law Group, LLC

(57) ABSTRACT

The present invention relates to a wavelength-tunable laser, which can tune an oscillating laser wavelength and can be manufactured in a small size, comprising: a laser diode chip (100) for emitting a laser beam; a partial reflection mirror (500) for optical feedback, which partially reflects the beam emitted from the laser diode chip (100) so as to enable the reflected beam to be fed back to the laser diode chip (100); a collimation lens (200) provided on an optical path between the laser diode chip (100) and the partial reflection mirror (500) for optical feedback so as to collimate the beam emitted from the laser diode chip (100); a wavelength-tunable selective filter (300) for converting the wavelength transmitted according to the temperature; a phase compensator (350) of which a refractive index is changed according to the temperature and which offsets a change in the refractive index according to the temperature of the semiconductor laser diode chip (100) or the wavelength-tunable selective filter (300); and a 45 degree reflection mirror (400) for switching the direction of the laser beam from the laser beam traveling in the horizontal direction with respect to a bottom (Continued)

surface of a package, to the laser beam traveling in the vertical direction with respect to the bottom surface of the package, wherein the laser diode chip (100), the wavelength-tunable selective filter (300), and the phase compensator (350) are disposed at an upper part of a thermoelectric element (900) so as to change the wavelength oscillating according to a change in the temperature of the thermoelectric element (900).

15 Claims, 18 Drawing Sheets

(51) Int. Cl.
    *H01S 5/10*       (2006.01)
    *H01S 5/00*       (2006.01)
    *H01S 5/068*      (2006.01)
    *H01S 5/14*       (2006.01)
    *H01S 5/0687*     (2006.01)
    *H01S 5/022*      (2006.01)

(52) U.S. Cl.
    CPC ........ *H01S 5/0687* (2013.01); *H01S 5/06804* (2013.01); *H01S 5/10* (2013.01); *H01S 5/14* (2013.01); *H01S 5/141* (2013.01); *H01S 5/02212* (2013.01); *H01S 5/02288* (2013.01); *H01S 5/02415* (2013.01)

(58) Field of Classification Search
    CPC ............. H01S 5/02288; H01S 5/02415; H01S 5/0005; H01S 5/02438; H01S 5/06804
    USPC .......................................................... 372/20
    See application file for complete search history.

(56) References Cited

U.S. PATENT DOCUMENTS

| | | |
|---|---|---|
| 2003/0086355 A1 | 5/2003 | Nogami |
| 2009/0154921 A1* | 6/2009 | Koyama .............. H04B 10/572 398/25 |
| 2014/0010250 A1* | 1/2014 | Gao .................... H01S 3/08036 372/20 |

FOREIGN PATENT DOCUMENTS

| | | |
|---|---|---|
| KR | 10-1124171 B1 | 3/2012 |
| KR | 10-1124173 B1 | 3/2012 |

* cited by examiner 100  110  200        300        350        500

100   110 200        330        350        550

WAVELENGTH-TUNABLE LASER

CROSS-REFERENCE TO RELATED APPLICATIONS

This application is the U.S. National Phase under 35 U.S.C. §371 of International Application No. PCT/KR/2014/002979 filed on Apr. 7, 2014, which in turn claims the benefit of Korean Application No. 10-2013-0037229, filed on Apr. 5, 2013, Korean Application No. 10-2013-0044221 filed on Apr. 22, 2013, the disclosures of which are incorporated by reference into the present application.

TECHNICAL FIELD

The present invention relates to a wavelength laser apparatus, and in particular to a wavelength tunable laser apparatus which can be manufactured compact-sized, wherein a laser wavelength may be tunable.

BACKGROUND ART

In recent years, a communication service capable of processing a lot of data including a motion picture, etc. for a smart phone, etc. becomes available. To this end, it needs to significantly increase a communication capacity in a conventional technology field. There is a DWDM (Dense Wavelength Division Multiplexing) which is able to increase a communication data using a previously installed optical fiber. The DWDM is directed to a method wherein lights with different wavelengths can be simultaneously transmitted using one optical fiber, which operation is available because there is not any interference between signals even though light signals of various wavelengths are transmitted at the same time through one optical fiber based on a principle wherein different laser lights with different wavelengths don't interfere with each other.

Now, a standard called NG-PON2 (Next Generation-Passive Optical Network Version 2) is being agreed throughout the world. The NG-PON2 standard uses a wavelength-tunable laser which is able to accommodate a 4-channel of 100 GHz frequency interval as a standard of an optical communication module installed at the side of a subscriber. The optical module for a subscriber of the NG-PON2 uses as basic standard a transceiver module called SFP (Small Firm Factor Pluggable). Here, since the SFP module package has a small volume, a 4-channel wavelength-tunable laser module should be made compact-sized.

Now, a wavelength-tunable laser of various types is being developed and sells in the market, however it in almost cases is made in a butterfly packet type with a photoelectric element which is large in volume, whereupon a large volume photoelectric element cannot be accommodated in a SFP transcriber module. The photoelectric element package sized to be accommodated in the SFP transceiver is a TO (Transistor Outline) type package, but a wavelength tunable TO type photoelectric element wherein a wavelength is tunable in a TO type is not yet available.

PRIOR ART TECHNOLOGY DOCUMENT

Patent Documents (Patent document 1) Korean patent registration publication number 10-1124171 (Feb. 29, 2012)

DISCLOSURE OF INVENTION

Accordingly, the present invention is made in an effort to resolve the above-mentioned problems. It is an object of the present invention to provide a wavelength tunable expansion resonator type laser apparatus which can be manufactured in a TO (Transistor Outline) package type which is compact-sized and has a low manufacturing cost.

It is another object of the present invention to provide a wavelength tunable laser apparatus which can be manufactured in a size which can be engaged at a conventional standardized SFP transceiver case in such a way to manufacture the size of a TO package smaller than a conventional butterfly type package with the aid of an arrangement of a laser diode package while using a low cost TO type package.

To achieve the above object, there is provided a semiconductor laser apparatus, which may include, but is not limited to, a laser diode chip configured to emit a laser beam; a light feedback partial reflection mirror configured to reflect part of the light emitting from the laser diode chip and feed back to the laser diode chip; a collimation lens which is installed on a light route between the laser diode chip and the light feedback partial reflection mirror and is configured to collimate the light emitting from the laser diode chip; a wavelength tunable selective filter wherein transmitting wavelengths change depending on temperature; a phase compensator which is configured to compensate any change in a refractive index based on temperature of the semiconductor laser diode chip or the wavelength tunable elective filter wherein the refractive index changes depending on temperature; and a 45-degree reflection mirror configured to convert the laser beam proceeding horizontally with respect to the bottom surface of the package into the direction of a laser beam proceeding vertically with respect to the bottom surface of the package, wherein the laser diode chip, the wavelength tunable selective filter, and the phase compensator are arranged on the top of a thermoelectric element, whereupon the wavelengths oscillating based on the change in temperature of the thermoelectric element change.

In addition, the light feedback partial reflection mirrors are arranged on the top of the 45-degree reflection mirror.

Meanwhile, the 45-degree reflection mirror is formed of a partial reflection mirror having a partial reflection/partial transmission characteristic, and a light detection photo diode is further arranged at one side of the 45-degree reflection mirror so as to detect the intensity of laser beam by receiving the laser beam of components which emit from the laser diode chip and pass through the 45-degree reflection mirror.

In addition, the 45-degree reflection mirror is formed of a partial reflection mirror having a partial reflection/partial transmission characteristic, and a light detection photo diode is further arranged at one side of the 45-degree reflection mirror so as to detect the intensity of laser beam by receiving the laser beam of components which emit from the light feedback partial reflection mirror and pass through the 45-degree reflection mirror.

In addition, the 45-degree reflection mirror is formed of a partial reflection mirror having a partial reflection/partial transmission characteristic, and at one side of the 45-degree reflection mirror, there are a wavelength filter and a photo diode on a light route of component which emits from the laser diode chip and transmits rough the 45-degree reflection mirror, wherein transmission factor changes depending on the wavelength, and at a lower side of the 45-reflection mirror, a photo diode is arranged on a light route of component which emits from the light feedback partial reflection mirror and transmits through the 45-degree reflection mirror, so a transmission factor of the wavelength filter and the wavelength of the laser beam can be obtained through a comparison of the photoelectric current flowing through the photo diode.

Meanwhile, the wavelength tunable selective filter is manufactured on a GaAs substrate using a compound semiconductor of Ga(x1)Al(1−x1)As/Ga(x2)Al(1−x2)As and is configured to transmit a light of a predetermined wavelength, wherein a Ga composition is preferably between 1 and 0.1. Here, the wavelength tunable selective filter is manufactured in such a way that an amorphous silicon (a-Si) and SiN (Silicon Nitride) are alternately deposited on a transparent substrate.

The wavelength tunable selective filter is formed of an etalon type filer having a plurality of transmission wavelength bands, and the light feedback partial reflection mirror has a predetermined set reflectivity at a wavelength band for oscillation, and the reflectivity at the remaining other wavelength band is below 80%, preferably below 25% as compared with the reflectivity of the oscillating wavelength band. Here, it is preferred that the wavelength tunable selective filter allows to form a reflection film in such a way that dielectric thin films with different refractive indexes are alternately deposited on both sides of a semiconductor substrate which includes any of silicon, GaAs and InP to provide a plurality of transmission wavelength bands.

In addition, the phase compensator is made of a polymer material containing any of PMMA, polyvinyl, polyethylene, polycarbonate, and epoxy.

It is preferred that the length of a laser resonator including the semiconductor laser diode chip, and the light feedback partial reflection mirror is 5.8 mm to 6.2 mm when calculating with an effective refractive index of 1.

Meanwhile, a stand able to fix a flat plate shaped reflection mirror at an angle of 45° with respect to a horizontal direction is formed of a rectangular parallelepiped silicon substrate, wherein the silicon substrate includes a through hole having an angle of 45° with respect to any of sides, so a flat plate shaped reflection mirror is fixedly inserted into the through hole, and the through hole formed on the silicon substrate is formed by a dry etching method.

Advantageous Effects

The wavelength tunable selective filter is manufactured in such a way to in turn deposit GaAs/GaAlAs on a GaAs semiconductor substrate, wherein a temperature dependency of a transmission wavelength of such a wavelength tunable selective filter is about 90 pm/° C. The laser of the method proposed by the present invention is determined in a Fabry-Perot mode which is determined by a resonator formed of a semiconductor laser diode chip and a partial reflection mirror within a wavelength range through which an oscillation wavelength passes through such a wavelength tunable selective filter. In the present invention, since the wavelength tunable selective filter and phase compensator which are configured based on a semiconductor laser diode chip and GaAs are arranged on a photoelectric element, the temperatures of the semiconductor laser diode chip, the wavelength tunable selective filter and the phase compensator may change in such a way to vary the temperature of the photoelectric element. The wavelength tunable selective filter formed of the semiconductor substance configured based on the semiconductor laser diode chip and GaAs has a positive (+) refractive index change wherein the refractive index increases as temperature increases, and the phase compensator has a negative (−) refractive index change as temperature increases. To this end, since the semiconductor laser diode chip, the wavelength tunable selective filter and the phase compensator are arranged on one photoelectric element, all will have the same temperature changes. The whole effective refractive index change of the laser resonator may not occur even though the temperature of the photoelectric element changes when arranging in the laser resonator a polymer material thickened enough to compensate for the refractive index change of the semiconductor laser diode chip and the wavelength tunable selective filter, whereupon the Fabry-Perot mode determined by the laser resonator may be fired at a predetermined wavelength irrespective of the temperature of the photoelectric element. If the temperature of the photoelectric element varies, the wavelength selected by the wavelength tunable selective filter varies, so a laser oscillation wavelength oscillating from the laser resonator varies, thus manufacturing a wavelength tunable laser at a low cost and in a simple way.

In the present invention, the resonator formed of the laser diode chip and a feedback reflection mirror is manufactured in a folder form, and a feedback partial reflection mirror are arranged on the top of a 45-degree reflection mirror, so a laser beam emitting horizontal from the laser diode chip is converted into a vertical direction. To this end, a route of beam can be adjusted meeting the requirements of the TO type package having a through hole through which a laser beam escapes, wherein the through hole is formed on a vertical surface of the TO type package. For this reason, a low cost TO type package can be used, and a manufacturing cost can be low as compared with the conventional laser package which uses an expensive butterfly type package.

Furthermore, in the present invention, since the laser diode chip and the light feedback partial reflection mirror are manufactured in a folder form, and the light feedback partial reflection mirror are arranged on the top of the 45-degree reflection mirror, which makes it possible to minimize the surface area of the bottom of the resonator. To this end, the surface area of the bottom can be minimized, so the product of the present invention can be mounted on a small sized TO package whose diameter is below 7 mm, which consequently can allow to manufacture a SFP transceiver using the TO package.

BRIEF DESCRIPTION OF DRAWINGS

FIG. 3 is a conception view for describing an oscillation wavelength determination in an expansion resonator type laser, of which FIG. 3A is a view illustrating an example of a transmittance curve of a wavelength tunable selective filter, FIG. 3B is a view illustrating an example of a Fabry-Perot mode determined by an expanded resonator, and FIG. 3C is a view illustrating an example of a wavelength characteristic of a laser beam resonating by means of an expanded resonator and a wavelength tunable selective filter.

FIG. 4 is a conception view illustrating an oscillation wavelength determination of an expanded resonator type wavelength tunable laser, of which FIG. 4A is a view illustrating an example of a curve wherein a transmittance of a wavelength tunable selective filter changes based on temperature, and FIG. 4B is a view illustrating an example of a change wherein a Fabry-Perot mode determined by an expanded resonator is determined based on temperature, and FIG. 4C is a view illustrating an example of a characteristic wherein a wavelength of a laser beam varies, which oscillates by a Fabry-Perot mode of an expanded resonator changing based on temperature and by a wavelength tunable selective filter changing based on temperature.

FIG. 7 is a conception view illustrating an oscillation wavelength determination of an expanded resonator type wavelength tunable laser which has a phase compensator according to the present invention, of which FIG. 7A is a curve illustrating an example where a transmittance of a wavelength tunable selective filter varies based on temperature, FIG. 7B is a view illustrating an example wherein a Fabry-Perot mode determined by an expanded resonator has a predetermined wavelength based on temperature, and FIG. 7C is a view illustrating an example of a wavelength change characteristic of a laser beam oscillating by a wavelength tunable selective filter which varies based on a Fabry-Perot mode which is maintained constant irrespective of change in temperature, and a temperature change.

MODES FOR CARRYING OUT THE INVENTION

The preferred embodiments not limited to this disclosure according to the present invention will be described with reference to the accompanying drawings.

Figure 1:
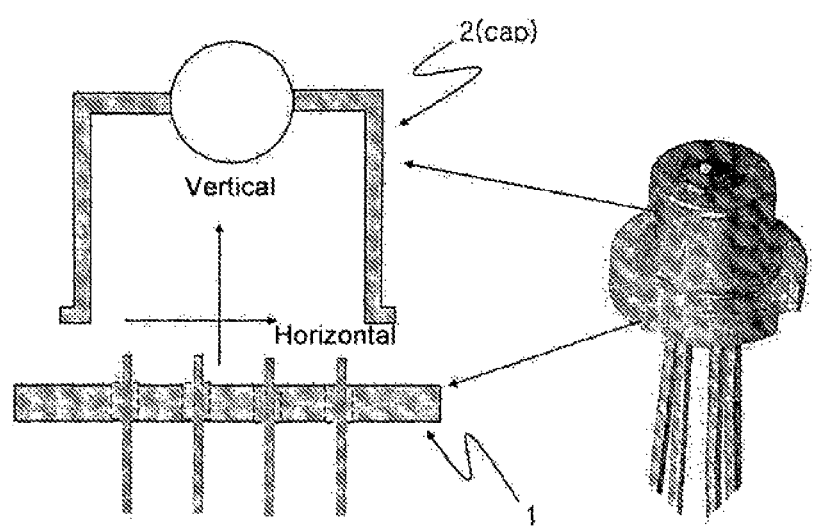
FIG. 1 is a view illustrating a schematic exterior of a TO type package.

FIG. 1 is a view illustrating a schematic exterior of a TO type package.

As illustrated in FIG. 1, the TO type package may be formed of a stem 1 and a cap 2. The TO type package may be manufactured in such a way that components are arranged on a bottom surface of the stem 1, and are sealed with the cap 2. In this structure, laser beam can be emitted to a TO type package expansion through a through hole formed on the top of the cap 2. The through hole of the cap 2 in general may include a lens or may be sealed with a flat glass window. In FIG. 1, a horizontal direction and a vertical direction which will be used throughout the specification are defined with arrow directions.

Figure 2:
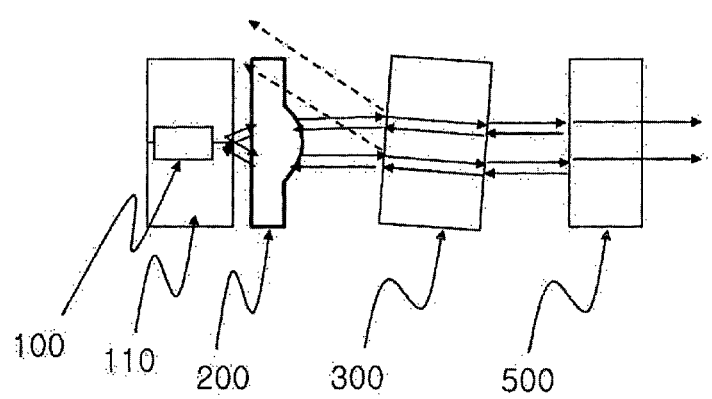
FIG. 2 is a conception view for describing an operation principle of an expanded resonator type laser diode package according to the present invention.

FIG. 2 is a conception view for describing an operation principle of an expanded resonator type laser diode package according to the present invention.

As illustrated in FIG. 2, the laser diode package according to the present invention may include, but is not limited to, a laser diode chip 100 installed at a laser diode chip sub-mount 110; a collimation lens 200 configured to collimate laser beam from the laser diode chip 100 into a parallel beam; a wavelength tunable selective filter 300 configured to selectively transmit light of a specific wavelength of the laser beam collimated through the collimation lens 200, thus allowing wavelengths to vary, which may be selected based on temperature; and a partial reflection mirror 500 which is configured to reflect part of laser beam of the laser beam transmitting through the wavelength tunable selective filter 300 and to transmit the remaining beam. The laser diode chip 100 and the wavelength tunable selective filter 300 are arranged on a thermoelectric element (not illustrated in the drawing) to adjust temperature.

The laser diode chip 100 is an edge-emitting type laser diode chip. This edge emitting type laser diode chip 100 is configured to emit laser beam from its both cut-away surfaces. The laser diode chip 100 is manufactured in such a way that a semiconductor laser is disposed on an InP substrate wherein an oscillation wavelength is 1100 nm~1700 nm. The cut-away surface of the laser diode chip facing the light feedback partial reflection mirror 500 may be a non-reflective coated surface (not-reflection surface) having reflectivity of below 1%. This non-reflection surface has reflectivity of below 1%, and it preferably has reflectivity of below 0.1%. More preferably, it has reflectivity of below 0.01%. If the cut-away surface in the opposite side of the non-reflective surface of the laser diode chip 100 in general has reflectivity of below 10%, and more preferably, it has reflectivity of above 80%. The laser diode chip 100 wherein one side of the cut-away surface is coated into a non-reflection surface does not has a formed Fabry-Perot mode wherein the laser diode chip 100 itself operates as a resonator since light does not feed back in the laser diode chip 100 itself. The light emitting from the laser diode chip 100 has a wavelength of light which has a very wide wavelength band (conventionally, the half width is above 20 nm). The light of a wide wavelength band emitting trough the non-reflective surface of the laser diode chip 100 is collimated into parallel light by means of the collimation lens 200. The light of a wide wavelength band collimated by means of the collimation lens 200 is incident upon the wavelength tunable selective filter 300 the transmission wavelength bandwidth of which is narrow. In the light being incident upon the wavelength tunable selective filter 300, the remaining light except for the light which transmits through the wavelength tunable selective filter 300 is reflected off the wavelength tunable selective filter 300 and is forwarded through another route wherein the light cannot feed back to the laser diode chip 100. The light of the component which has transmitted through the wavelength tunable selective filter 300 through the collimation lens 20 from the laser diode chip 100 arrives at the light feedback particle reflection mirror 500. In the light which arrives at the light feedback partial reflection mirror 500, the light which reflects off the light feedback partial reflection mirror 500 is fed back to the laser diode chip 100 through the wavelength tunable selective filter 300 and through the collimation lens 200. In this way, the expanded resonator type laser can be manufactured, which includes the laser diode chip 100, the collimation lens 200, the wavelength tunable selective filter 300 and the light feedback partial reflection mirror 500.

If the transmission bandwidth of the wavelength tunable selective filter 300 is too narrow, the insertion loss of the light which transmits through the wavelength tunable selective filter 300 increases, and if the transmission bandwidth of the wavelength tunable selective filter 300 is too wide, it is hard to select one Fabry-Perot mode in terms of effectiveness. Therefore, it is preferred that the transmission bandwidth of the wavelength tunable selective filer 300 is appropriately selected in consideration of the insertion loss in light and effective Fabry-Perot mode selective. In the present invention, the transmission bandwidth width of the wavelength tunable selective filter 300 is below 10 nm, and preferably, it is set between 0.25 nm and 3 nm. Here, the wavelength tunable selective filter 300 is manufactured in such a way to let the light effectively transmit at a previously and specifically set specific wavelength and reflect at the other wavelengths by using a compound semiconductor of Ga(x1)Al(1-x1)As/Ga(x2)Al(1-x2)As on the GaAs substrate. It is preferred that the Ga composition in Ga(x)Al(1-x)As is in a range from 1 to 0.1. More preferably, the wavelength tunable selective filter 300 is manufactured in such a way to sequentially laminate GaAs/AlGaAs based on the GaAs substrate. The above GaAs/AlaAs-based wavelength tunable selective filter 300 has a refractive index which varies based on temperature. To this end, the transmitting wavelength band changes within a range of 90 pm/° C. to 100 pm/° C. So, the oscillation wavelength selected by the expanded resonator type laser changes. In addition, the wavelength tunable selective filter 300 may be manufactured in such a way that an amorphous silicon (a-Si) and SiN (Silicon Nitride) are alternately laminated on a transparent substrate based on considered wavelength, for example, glass or quarts.

In case of the light feedback partial reflection mirror 500, if a refractive index is too low, the quantity of light being fed back to the laser diode chip 100 for the reason of wavelength locking is too small, whereupon the wavelength locking of the laser is not appropriately performed, and if the refractive index of the mirror of the light feedback partial reflection mirror 500 is too high, a signal which will be used for light transmission through the light feedback partial reflection mirror 500 becomes too weak, thus causing a problem. Therefore, it is preferred that the reflectivity of the light feedback partial reflection mirror 500 is appropriately set.

The reflectivity of the light feedback partial reflection mirror 500 in the embodiment of the present invention is set to about 20% to 80%.

Figure 3:
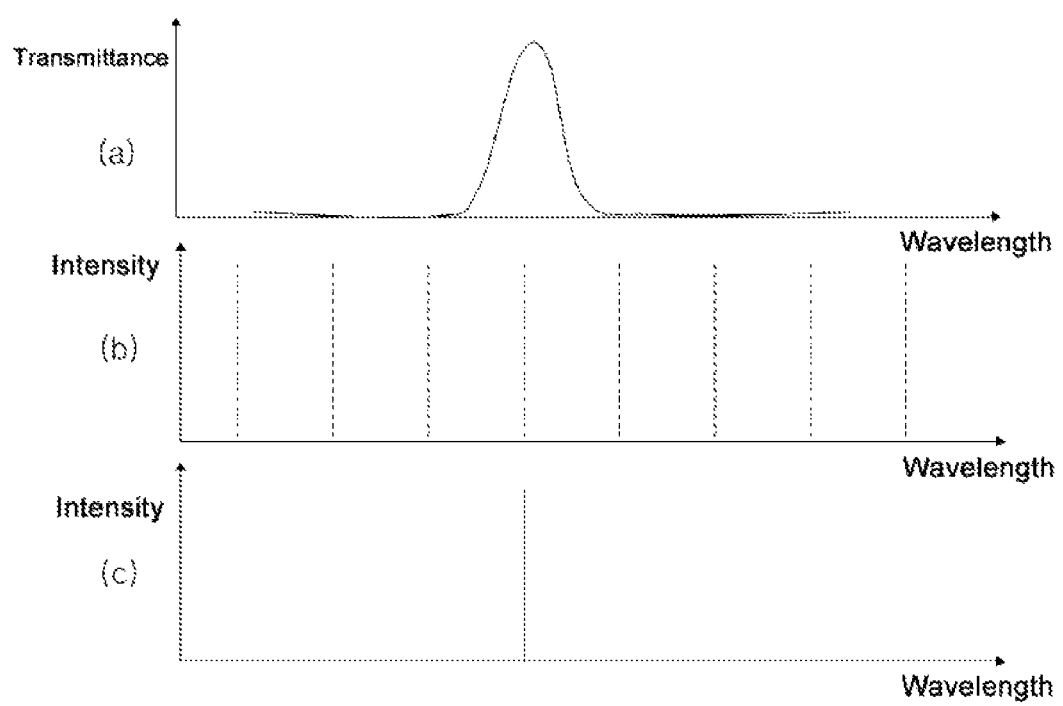

FIG. 3 is a conception view for describing an oscillation wavelength determination in an expansion resonator type laser, of which FIG. 3A is a view illustrating an example of a transmittance curve of a wavelength tunable selective filter, FIG. 3B is a view illustrating an example of a Fabry-Perot mode determined by an expanded resonator, and FIG. 3C is a view illustrating an example of a wavelength characteristic of a laser beam resonating by means of an expanded resonator and a wavelength tunable selective filter. The wavelength determined by the expanded resonator type laser may be determined by two factors, namely, a transmission band of the wavelength tunable selective filter having one transmission wavelength band at a considered wavelength band as illustrated in FIG. 3A and a periodic and non-continuous Fabry-Perot mode determined by an expanded resonator length as illustrated in FIG. 3B, thus oscillating a determined specific wavelength as illustrated in FIG. 3C.

In the resonator structure as in FIG. 2, in the non-continuous Fabry-Perot permission mode wherein a laser oscillation is available by the expanded resonator in FIG. 3B, only the modes in the transmission band of the wavelength tunable selective filter in FIG. 3A come to resonate the expanded resonator, thus providing a laser oscillation. To this end, a laser beam having a specific wavelength as in FIG. 3C can generate.

Meanwhile, when the resonator structure in FIG. 2 is mounted on the thermoelectric element, and the temperature of the thermoelectric element is changed, the temperatures of the semiconductor laser diode chip 100 and the wavelength tunable selective filter 300 both arranged on the thermoelectric element can be changed. The semiconductor laser diode chip 100 manufactured using the InP substrate and the wavelength tunable selective filter 300 manufactured based on the GaAs substrate may have a change in refractive index of about $2 \times 10^{-4}$ depending on temperature.

Figure 4:
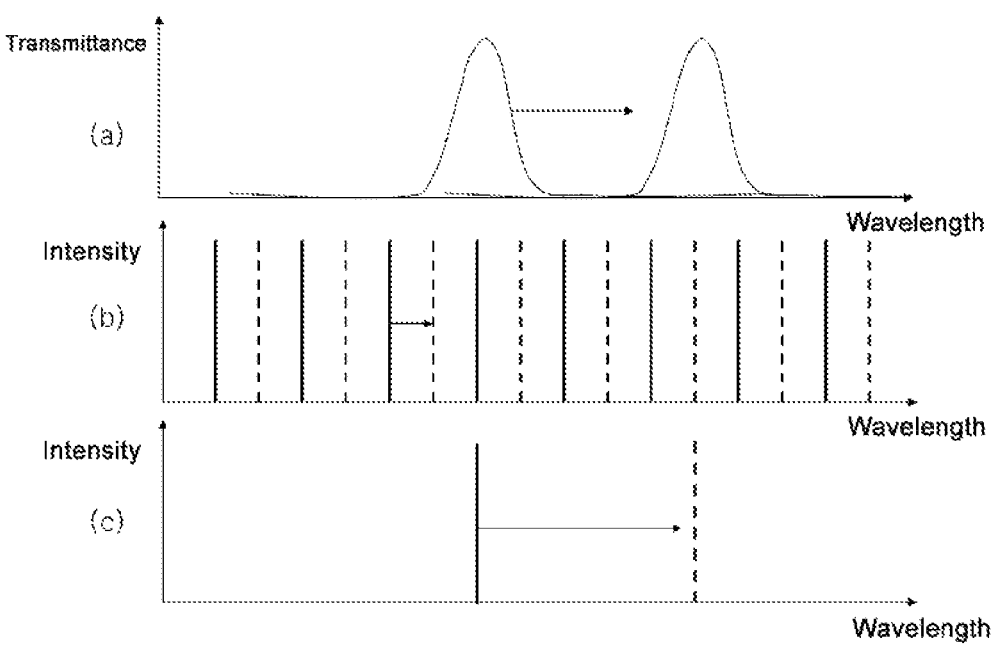

FIG. 4 is a conception view illustrating an oscillation wavelength determination of an expanded resonator type wavelength tunable laser, of which FIG. 4A is a view illustrating an example of a curve wherein a transmittance of a wavelength tunable selective filter changes based on temperature, and FIG. 4B is a view illustrating an example of a change wherein a Fabry-Perot mode determined by an expanded resonator is determined based on temperature, and FIG. 4C is a view illustrating an example of a characteristic wherein a wavelength of a laser beam varies, which oscillates by a Fabry-Perot mode of an expanded resonator changing based on temperature and by a wavelength tunable selective filter changing based on temperature.

The transmission band of the wavelength tunable selective filter 300, as illustrated in FIG. 4A, with respect to the temperature change of the thermoelectric element may move by 90 pm/° C. to 100 pm/° C. At this time, since the refractive indexes of the laser diode chip 100 and the wavelength tunable selective filter 300 which are components forming the resonator change, the Fabry-Perot mode of the whole resonator also changes as in FIG. 4B. Therefore, as for the actually oscillating wavelengths, the Fabry-Perot mode in the transmission band of the wavelength tunable selective filter 300 in the Fabry-Perot mode wherein the wavelength has changed as in FIG. 4C will oscillate, whereupon the wavelength of the laser beam emitting from the laser resonator can vary.

Figure 5:
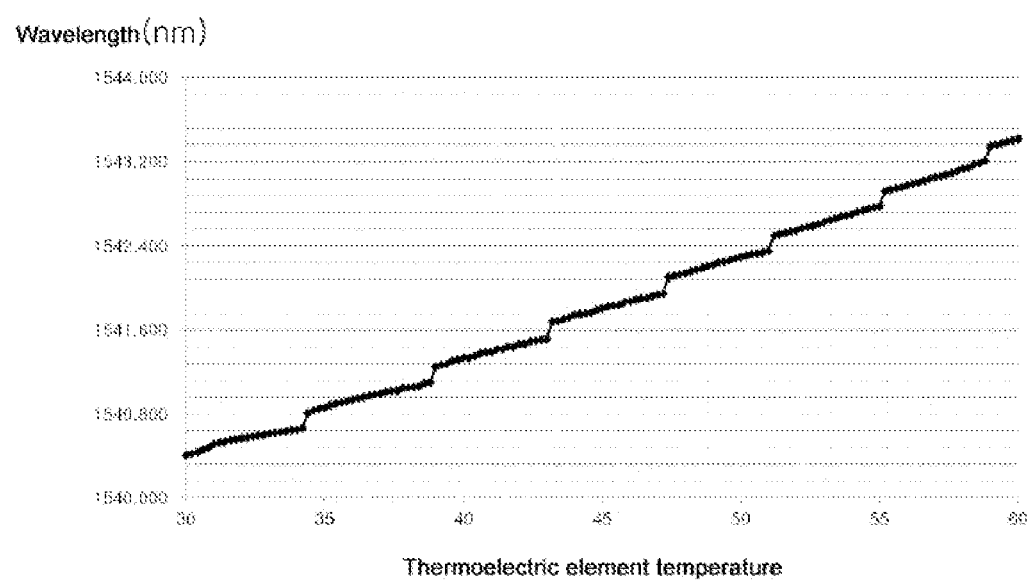
FIG. 5 is a conception view illustrating a state where a laser wavelength varies, which oscillates based on a temperature change in a resonator in a laser resonator structure in FIG. 2.

If the temperature of the thermoelectric element of the laser resonator structure in FIG. 2 is changed, non-continuous wavelength changes may simultaneously occur based on the characteristics where the Fabry-Perot mode of the resonator continuously changes and the characteristics where the non-continuous Fabry-Perot mode selection of the wavelength tunable selective filter 300 changes. FIG. 5 is a view illustrating an example of a wavelength change of a laser resonator based on a change in a thermoelectric element temperature. If the temperature of the laser resonator is changed in the expanded resonator type laser, since the portion where the oscillation wavelength of the laser continuously changes and the portion where the oscillation wavelength of the laser continuously change are present together.

For this reason, it is hard to maintain constant the oscillation wavelengths in the laser resonator. As illustrated in FIG. 5, since the laser oscillation wavelength varies by 60~70 pm/° C. in the section where the oscillation wavelengths continuously change, it needs to very accurately adjust the temperature of the thermoelectric element so as to accurate the wavelength of laser beam.

Namely, in the laser resonator structure in FIG. 2, if the temperature of the laser resonator varies, the oscillation wavelengths may continuously change based on the temperature of the laser resonator in the section where the oscillation wavelengths non-continuously change, whereupon it becomes hard to adjust oscillation wavelengths. In the present invention, in order to resolve the problems where it is hard to adjust such oscillation wavelengths, a phase compensator is arranged in the laser diode so as to compensate any change in the refractive indexes based on the temperatures of the semiconductor laser diode chip 100 and the GaAs/AlGaAs wavelength tunable selective filter 300.

Figure 6:
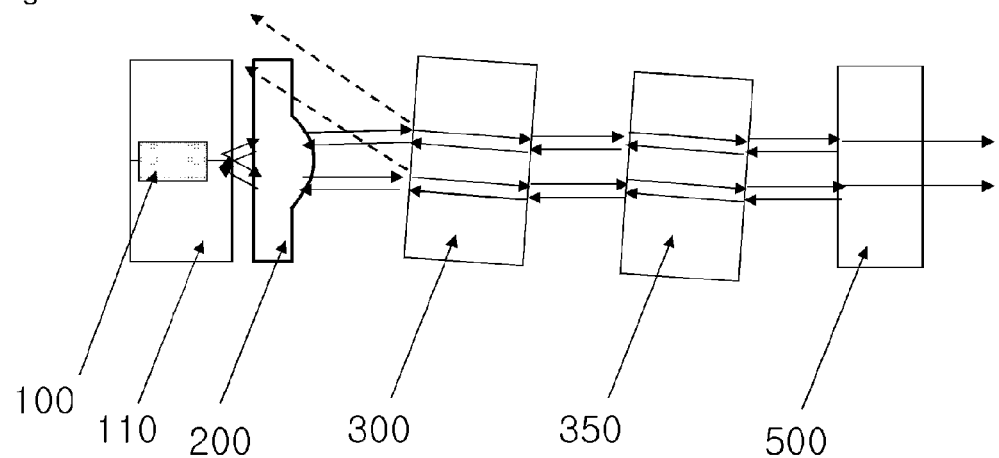
FIG. 6 is an installation conception view illustrating a laser apparatus having a resonator structure with a phase compensator according to the present invention.

FIG. 6 is a view illustrating an installation conception of a laser apparatus which has a folder type resonator with a phase compensator according to an embodiment of the present invention. The phase compensator 350 is arranged on an optical route between the wavelength tunable selective filter 300 and the light feedback partial reflection mirror 500.

In the embodiment of the present invention, the phase compensator 350 is made of a polymer material, for example, polyvinyl, polyethylene, polycarbonate, PMMA, epoxy, etc. This polymer material may have a negative (−) change in refractive index as temperature increases. When light reflects off the phase compensator 350, it may interfere with the operation of laser, so it is preferred to coat non-reflective the surfaces through which laser beam of the phase compensator 350 passes.

Meanwhile, the Fabry-Perot mode of the laser resonator is determined by an optical length of the laser resonator. As temperature increases, the semiconductor laser diode chip 100 and the GaAs/AlGaAs wavelength tunable selective filter 300 have positive (+) refractive indexes. A glass lens, etc. may be added to the laser resonator, but this component may allow to provide a positive (+) refractive index, but weak, as the temperature increases. Therefore, in the resonator structure in FIG. 2, as temperature increases, the effective refractive index of the whole laser resonator changes into a positive (+) value. In this way, as the temperature of the laser resonator increases, the Fabry-Perot mode can have a positive (+) oscillation wavelength change.

The polymer material, for example, polyvinyl, polyethylene, PMMA, etc., however, shows a negative refractive index change as temperature increases. The phase compensator 350 manufactured using a polymer material with a predetermined thickness thick enough to compensate a refractive index change due to the temperature of the semiconductor laser diode chip 100 and the wavelength tunable selective filter 300 may be arranged in the resonator. In this state, since the semiconductor laser diode chip 100, the wavelength tunable selective filter 300 and the phase compensator 350 may have the same temperature changes due to the same thermoelectric elements. To this end, it is possible to maintain constant the whole effective refractive indexes of the resonator irrespective of any changes in the temperature of the thermoelectric element. Therefore, the Fabry-Perot mode determined by the effective refractive index of the resonator may have constant values irrespective of the temperature of the thermoelectric element.

Figure 7:
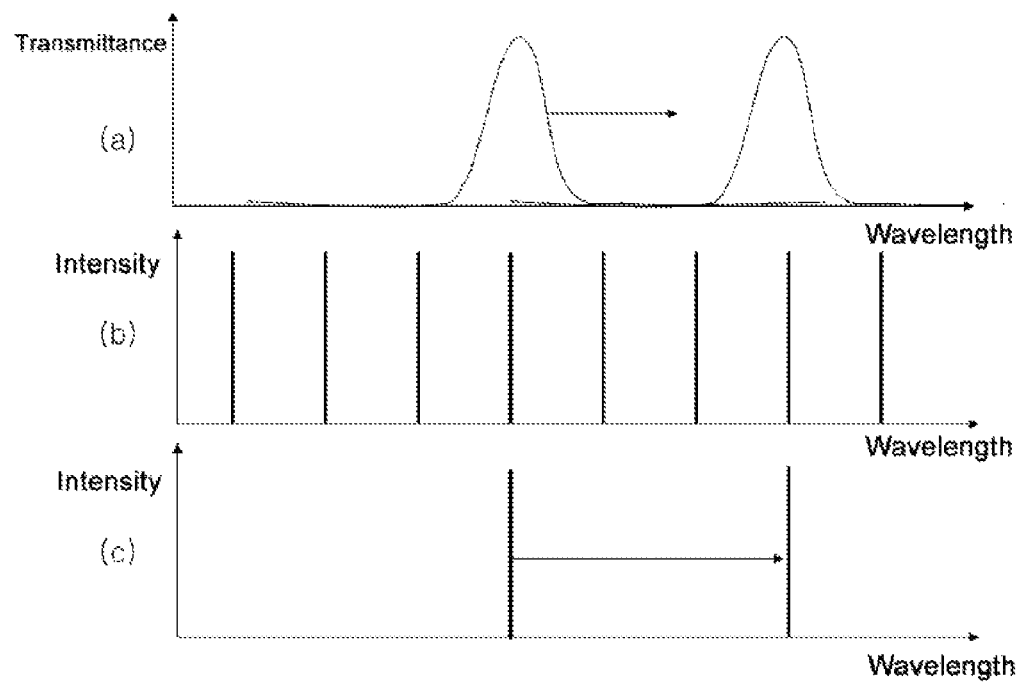

FIG. 7 is a conception view illustrating an oscillation wavelength determination of an expanded resonator type wavelength tunable laser which has a phase compensator according to the present invention, of which FIG. 7A is a curve illustrating an example where a transmittance of a wavelength tunable selective filter varies based on temperature, FIG. 7B is a view illustrating an example wherein a Fabry-Perot mode determined by an expanded resonator has a predetermined wavelength based on temperature, and FIG. 7C is a view illustrating an example of a wavelength change characteristic of a laser beam oscillating by a wavelength tunable selective filter which varies based on a Fabry-Perot mode which is maintained constant irrespective of change in temperature, and a temperature change.

In the wavelength tunable selective filter 300, there is a changing wavelength which transmits based on the change in temperature and is selected, the transmission wavelength band of the wavelength tunable selective filer, as illustrated in FIG. 7A, changes based on the temperature. On the other hand, in the resonator structure in FIG. 6 in which the phase compensator is inserted, the Fabry-Perot mode may be determined with a wavelength which has nothing to do with the temperature in FIG. 7B. To this end, the laser oscillation wavelength determined with the Fabry-Perot mode in the wavelength tunable selective filter 300 may be determined as in FIG. 7C.

Figure 8:
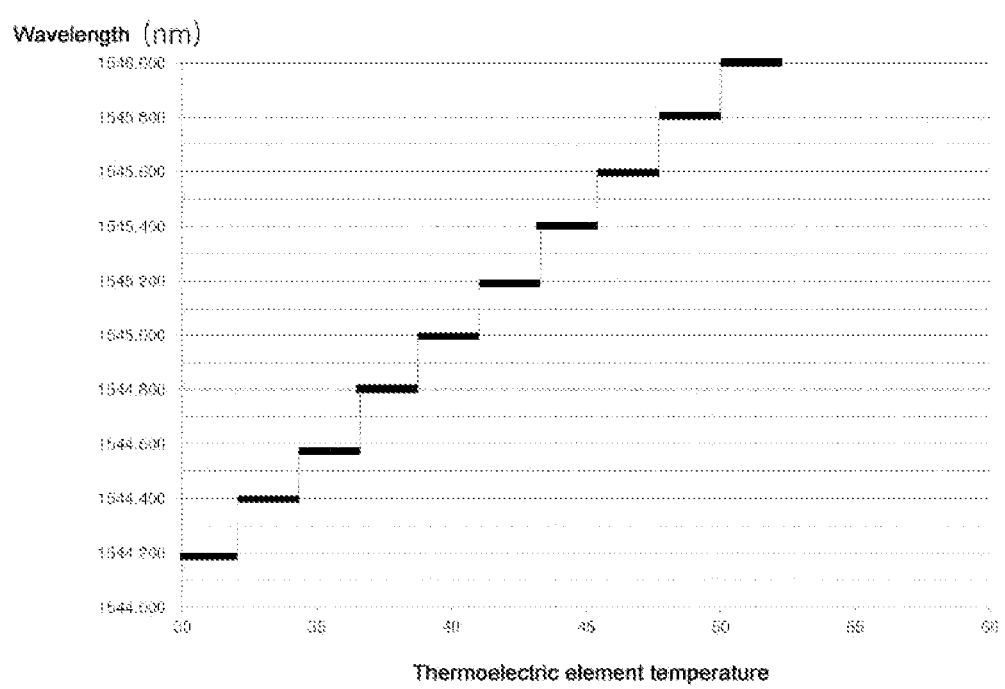
FIG. 8 is a conception view illustrating a state where a laser wavelength oscillating based on a temperature change of a resonator in a laser resonator structure according to the present invention.

FIG. 8 is a conception view illustrating a state where a laser wavelength oscillating based on a temperature change of a resonator in a laser resonator structure according to the present invention.

As illustrated in FIG. 8, if the semiconductor laser diode chip 100, the wavelength tunable selective filter 300 and the phase compensator 350 made of a polymer material are arranged on one thermoelectric element, different from the occasion in FIG. 5, the laser wavelength oscillating from the laser resonator as the temperature of the thermoelectric element varies, may change in such a way that with the oscillation laser wavelength being maintained constant, the wavelengths change in such a way the wavelengths are suddenly changed.

Since the current optical communication is implemented with a 100 GHz wavelength interval or a 50 GHz wavelength interval, the mode interval of the laser resonator according to the present invention may be expressed as in Formula 1 based on the length of the laser resonator.

Formula 1

$$\omega\lambda = C \tag{1}$$

$$\omega = mC/2(2nd) \tag{2}$$

$$\Delta\omega = C/(2nd) \tag{3}$$

where
ω is the frequency of oscillating laser beam
λ is the wavelength in the air of oscillating laser beam
C is a light speed in vacuum
m=integer
nd=the length of a laser resonator if the refractive index of the laser resonator is calculated as 1

If the Fabry-Perot mode of the laser resonator is a 100 GHz interval, the length of the resonator calculated with a refractive index of 1 is about 24 mm, and if the Fabry-Perot mode is a 50 GHz interval, the length of the resonator calculated with a refractive index of 1 is about 12 mm, and if the Fabry-Perot mode is a 25 GHz interval, the length of the resonator calculated with a refractive index of 1 is about 6 mm.

The length of the resonator of 24 mm or 12 mm may not fit into the package of the subminiature TO can type. Since the length of the resonator grows, the temperature may become non-uniform in the inside of the thermoelectric element. In addition, the frequency difference of 12.5 GHz may require a resonator length of 3 mm. With respect to this kind of short length of the resonator, it is hard to arrange the collimation lens 200, the wavelength tunable selective filter 300 and the phase compensator 350. To this end, the length of the resonator calculated with a refractive index of 1 may be preferably 6 mm in order to manufacture a laser which has a wavelength interval of 50 Ghz or 100 GHz which are the international communication protocol. It is preferred that the length of the laser resonator calculated with a refractive index of 1 should be adjusted within a range of 5.8 mm to 6.2 mm in order to guarantee an accuracy (+/−12.5 GHz) of the wavelength which is required by the internal communication protocol.

In general, in case of the TO type package mounted on the SFP transceiver, all components should be accommodated within an inner diameter of the cap 2 as in FIG. 1. The light emitting from the TO type package should be emitted from a center portion of the TO type package. To this end, a 45-degree reflection mirror capable of converting a horizontal direction laser beam into a vertical direction laser beam is necessary to emit the laser beam, which is transmitting in a horizontal direction, toward the outside of the TO package cap 2 positioning above. This 45-degree reflection mirror should position vertical below the cap 2 of the TO type package.

Figure 9:
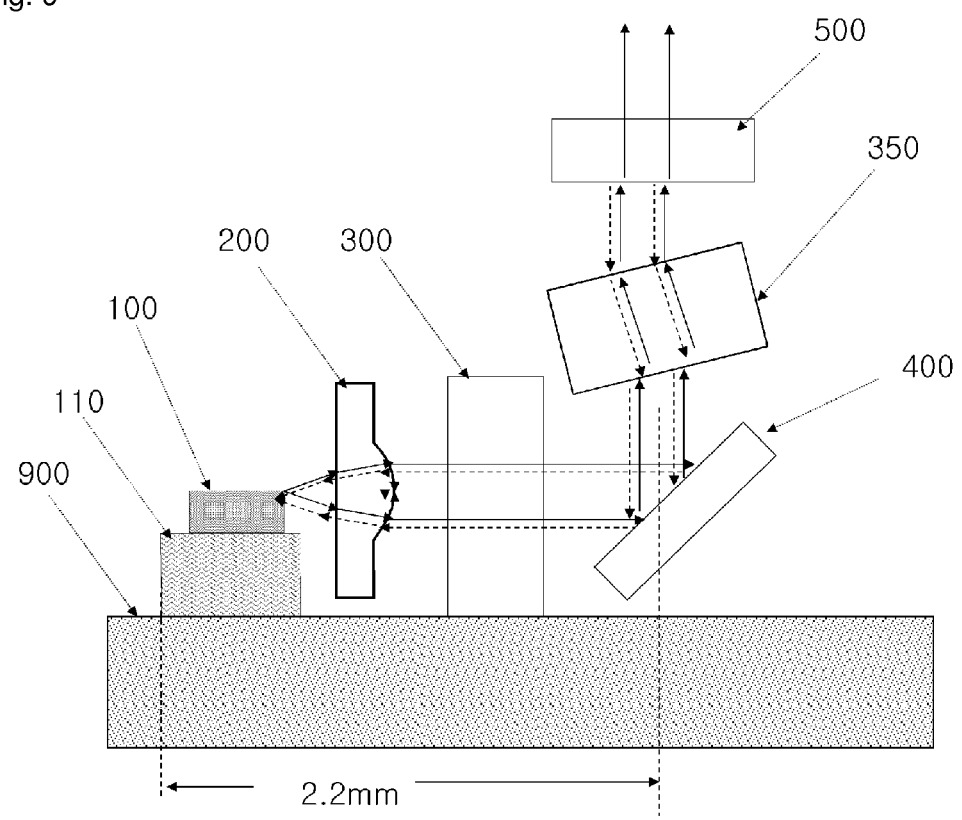
FIG. 9 is an installation conception view illustrating a laser apparatus having a folder type resonator structure according to an embodiment of the present invention.

FIG. 9 is an installation conception view illustrating a laser apparatus having a folder type resonator structure according to an embodiment of the present invention, wherein a 45-degree reflection mirror 400 capable of converting laser beam into a vertical direction is disposed at one side of the light feedback partial reflection mirror 500.

In general, the inner diameter of the TO type package mounted on the SFP transceiver is max 4.4 mm, and the length between the laser diode chip 100 and the 45-degree reflection mirror 400 should be physically within 2.2 mm for the light from escape from the center of the TO type package cap 2.

The currently available expanded resonator type laser diode chip 100 has min 400 um, and in consideration of the heat emission of the laser diode chip 100, the length of the sub-mount 110 of the laser diode chip 100 is about 700 um. The thickness of the collimation lens 200 which is able to provide a predetermined size of beam is about 400 um, and the thickness of the wavelength tunable selective filter 30 is about min 500 um in consideration of the stress due to a dielectric thin film deposited on the wavelength tunable selective filter 300. In addition, the thickness of the light feedback partial reflection mirror 500 is typically in a range from 300 um to 500 um, and the size of the 45-degree reflection mirror 400 may be about 1000 um. A marginal space of min 150 um is necessary between each component so as to align each parts. To this end, as illustrated in FIG. 6, if such components are arranged in a row on the top of the thermoelectric element 900 of the TO type package, the length from the laser diode chip 100 to the center point of the 45-degree reflection mirror 400 increases to about 2.7 mm in consideration of the necessary space between each component, whereupon the light may not escape from the center portion of the TO type package.

In addition, considering that the refractive index of the laser diode chip 100 is about 3.5, and the refractive index of each of the collimation lens 200 made of a glass material, the wavelength tunable selective filter 300, the light feedback partial reflection mirror 500 is 1.5, the effective optical resonator length of the expanded resonator including the laser diode chip 100 and the light feedback partial reflection mirror 100 (calculated with a refractive index of 1) is about 4 mm. If the length of the optical resonator is 4 mm, the interval between the resonator Fabry-Perot modes in FIG. 3B is about 300 pm. If the oscillation wavelength hops into the neighboring Fabry-Perot mode due to the unstable operation of laser, this is called a mode hopping. The DWDM proposes that the wavelength including such a mode hopping is within a range of +/−100 pm from the wavelength range previously regulated by the international organization. Therefore, it is preferred that the optical effective resonator length of the expanded resonator should be at least within a range of 5.8 mm to 6.2 mm for the wavelength to be within a range of 100 pm at the time of mode hopping. If the resonator is arranged in one dimension as in FIG. 6, increasing the effective resonator length of the expanded resonator may be likely to entail an increase in the horizontal direction length of the resonator, so a problem may occur, wherein the point where the laser beam escapes from the TO package becomes far away from the center of the TO package.

In order to resolve the above-mentioned problems, the present invention brings an expanded resonator type laser structure of the folder type in FIG. 9. In case where the resonator is arranged as in FIG. 9, a direct relationship between the length of the resonator and the escape point of the TO package may not exist, so it may be advantageous to manufacture an expanded resonator type laser of a long resonator structure using a TO can package with a narrow surface area. In the structure in FIG. 9, the wavelength tunable selective filter 300 may be directly fixed at the thermoelectric element, and the phase compensator 350 may be arranged on the top of the 45-degree reflection mirror 400.

Figure 10:
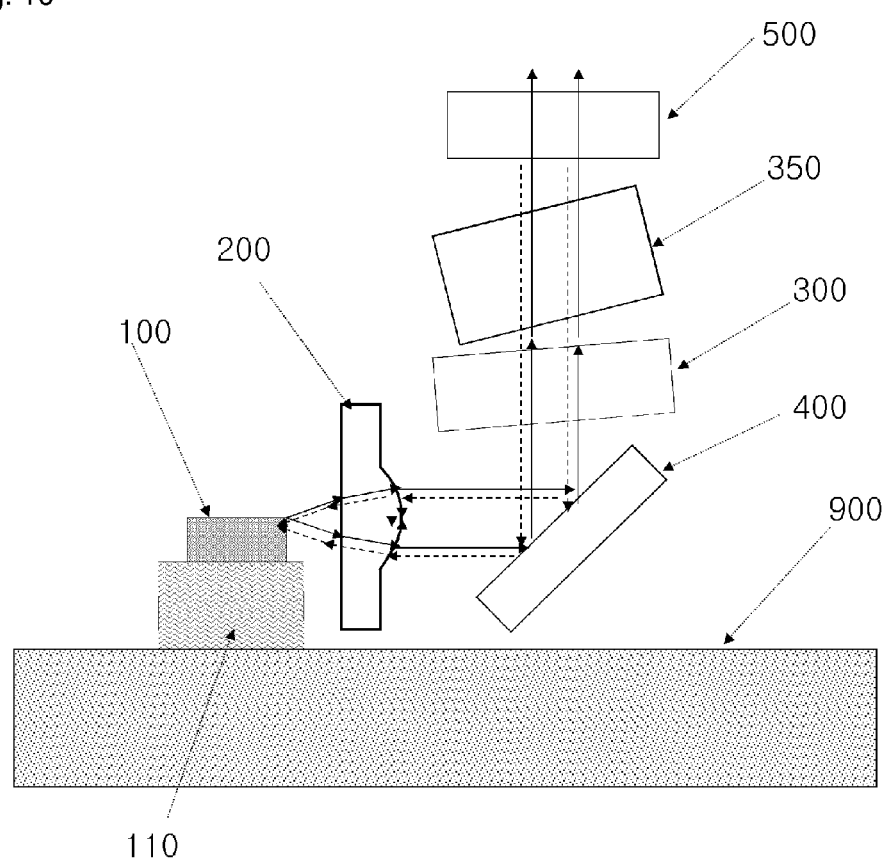
FIG. 10 is an installation conception view illustrating a laser apparatus according to another embodiment of the present invention.

FIG. 10 is an installation conception view illustrating a laser apparatus according to another embodiment of the present invention. As illustrated therein, the wavelength tunable selective filter 30, the phase compensator 350 and the light feedback partial reflection mirror 500 are arranged on the top of the 45-degree reflection mirror 400. In the above arrangement, the horizontal direction length of the resonator is below 1.5 mm, and the optical length of the resonator is above 6 mm.

Figure 11:
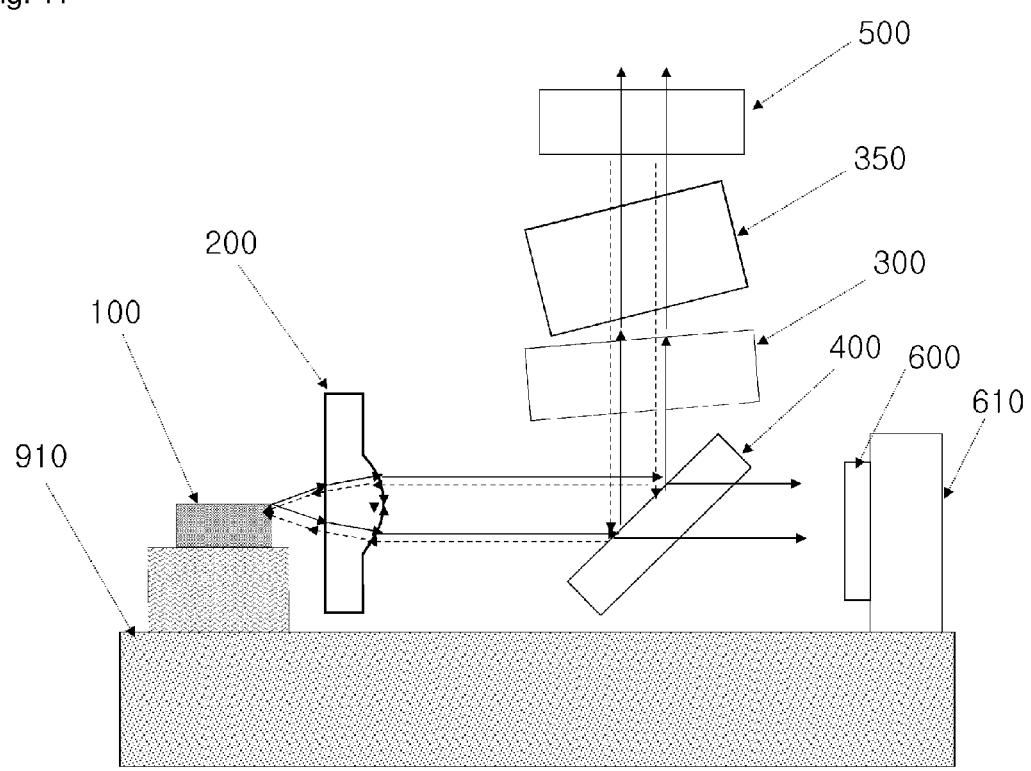
FIG. 11 is an installation conception view illustrating a laser apparatus wherein a light detection photo diode is arranged according to the present invention.

FIG. 11 is an installation conception view illustrating a laser apparatus wherein a light detection photo diode is arranged according to an embodiment of the present invention.

As illustrated in FIG. 11, the 45-degree reflection mirror 400 is manufactured with a partial reflection mirror. The light detection photo diode 600 attached to the diode sub-mount 610 is arranged at a rear end of the 45-degree reflection mirror 400, thus allowing part of the light which is incident upon the 45-degree reflection mirror 400 to transmit through the 45-degree reflection mirror 400 into the light detection photo diode 600, thus detecting the intensity of laser beam. In this arrangement, since a light intensity detection photo diode 600 is arranged opposite to the laser resonator with respect to the center point of the TO package, an inner space of the TO type package can be efficiently used.

As illustrated in FIG. 11, the intensity of light might be detected in such a way to transmit part of the light which emits from the laser diode chip 100 and is incident upon the 45-degree reflection mirror 400 and allow it to enter the light detection photo diode 600, but a light detection photo diode 600 may be installed at a lower side of the 45-degree reflection mirror 400, thus detecting the intensity of light.

Figure 12:
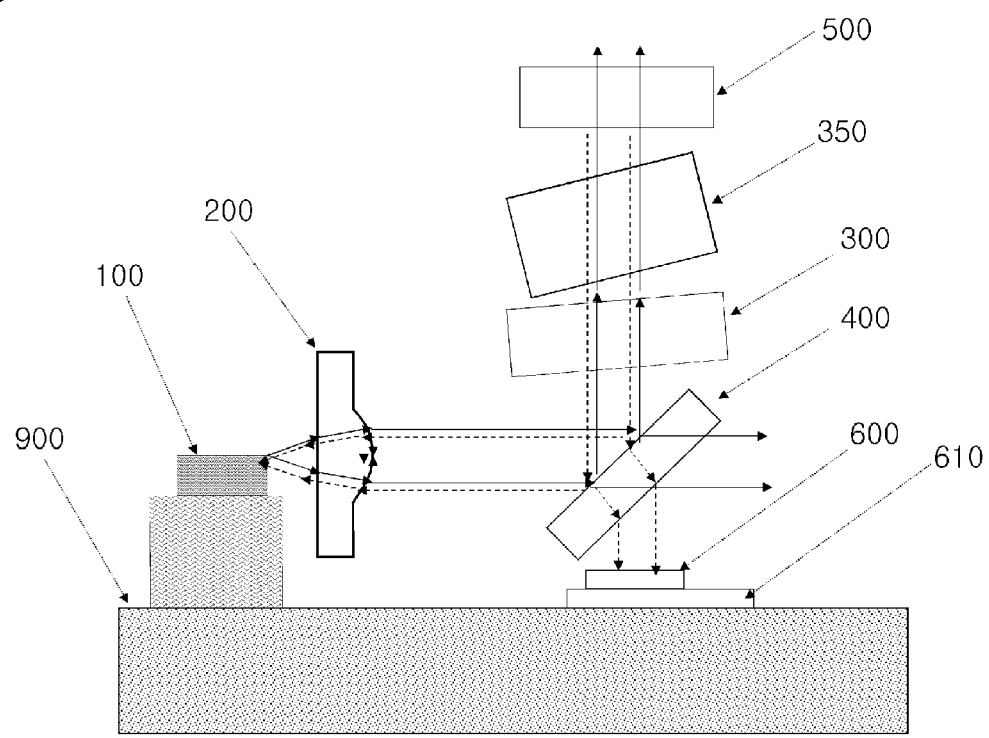
FIG. 12 is another installation conception view illustrating a laser apparatus wherein a light detection photo diode is arranged according to the present invention.

FIG. 12 is an installation conception view illustrating a configuration wherein such a light detection photo diode is arranged at a lower side of the 45-degree reflection mirror. As illustrated in FIG. 12, if the 45-degree reflection mirror 400 has a function like a partial reflection mirror, when in the light which is reflected off the 45-degree reflection mirror 400 and is incident upon the light feedback partial reflection mirror 500 of the upper side, the light of the route which is reflected off the light feedback partial reflection mirror 500 and transmits back to the laser diode chip 100 reaches the 45-degree reflection mirror 400, the transmission of light which transmits through the 45-degree reflection mirror 400 occurs. In this way, since the light which proceeds from the light feedback partial reflection mirror 500 to the 45-degree reflection mirror 400 and transmits through the 45-degree reflection mirror 400 reaches a lower surface of the 45-degree reflection mirror 400, it is possible to perform a light intensity detection function even though the light detection photo diode 600 as illustrated in FIG. 12 is arranged at a lower side of the 45-degree reflection mirror 400. Since the lower arrangement of the 45-degree reflection mirror 400 of the light detection photo diode 600 does not allow to increase a horizontal axial length of the expanded resonator, it is a way to maximally use the inner surface area of the TO type package.

Figure 13:
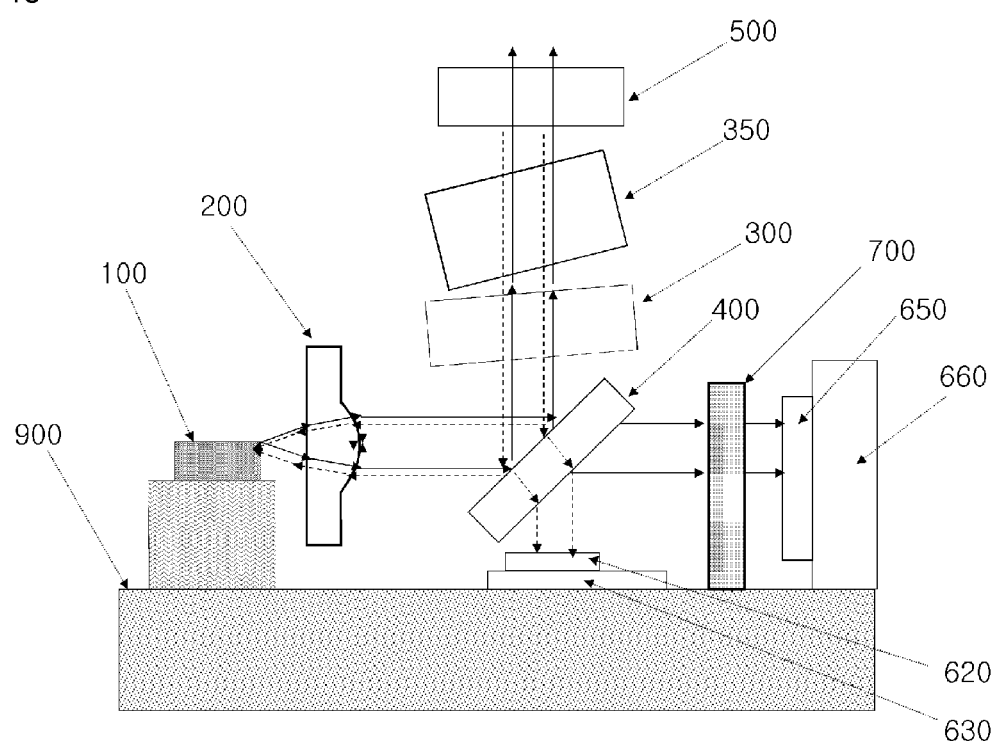
FIG. 13 is an installation conception view illustrating a laser apparatus according to another embodiment of the present invention.

FIG. 13 is an installation conception view illustrating a laser according to another embodiment of the present invention, which is directed to a method for detecting the wavelength of a laser beam by using the light which transmits the 45-degree reflection mirror 400 in a vertical direction and the light which transmits in a horizontal direction.

As illustrated in FIG. 13, a wavelength filter 700 the transmittance of which changes based on wavelength is inserted into a route of the light which horizontally transmits the 45-degree reflection mirror 400, and the wavelength detection photo diode 650 is attached to a route of the light which transmits through the wavelength filter 700. In addition, an output detection photo diode 620 is arranged on a route of light which vertically transmits through the 45-degree reflection mirror 400. A ratio that light transmits through the wavelength filter 700 can be obtained by dividing the photoelectric current of the thusly arranged wavelength detection photo diode 650 by the photoelectric current flowing through the output detection photo diode 620, and the wavelength of the laser beam can be obtained with the aid of such a ratio. At this time, it is preferred that the characteristic of the wavelength filter 700 does not vary based on temperature or the wavelength characteristic can change within 15 pm/° C. based on temperature. More preferably, it is appropriate that the wavelength characteristic varies within 3 pm/° C. based on temperature.

Figure 14:
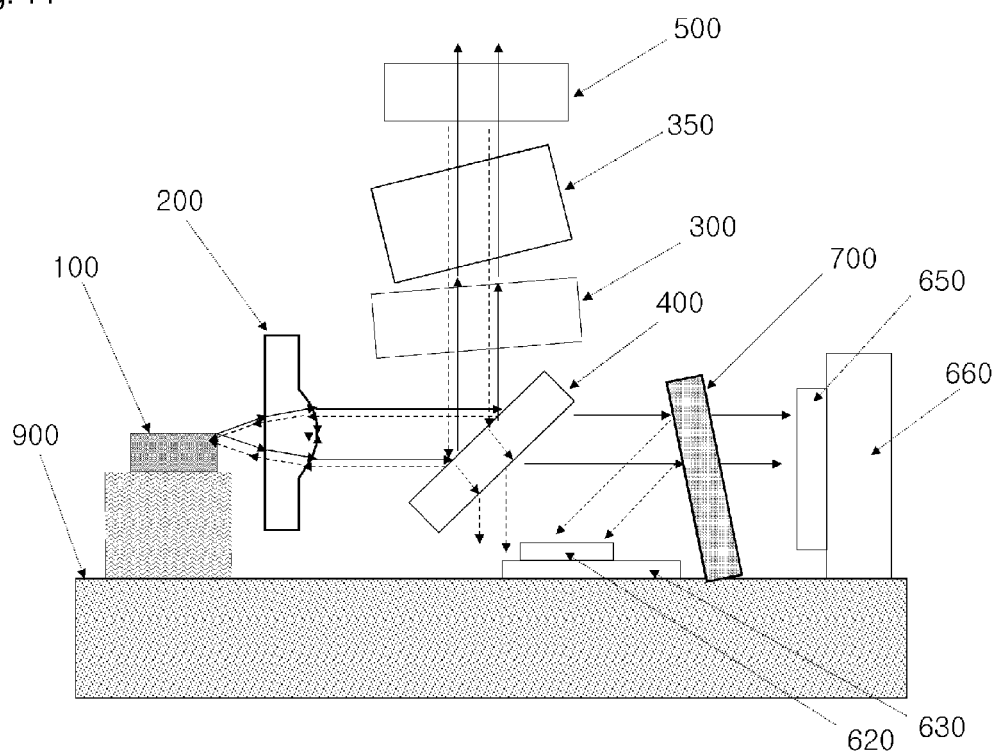
FIG. 14 is an installation conception view illustrating a laser apparatus according to another embodiment of the present invention.

FIG. 14 is an installation concept view illustrating a laser apparatus according to another embodiment of the present invention, wherein a wavelength filter 700 the transmittance of which varies based on the wavelength is arranged on the route of light which horizontally transmits through the 45-degree reflection mirror 400, and the wavelength detection photo diode 650 is attached to the route of the light which transmits through the wavelength filter 700. In addition, the output detection photo diode 620 is arranged on the route of the light which reflects off the wavelength filter 700. The photoelectric current of the thusly arranged wavelength detection photo diode 650 is compared with the photoelectric current flowing at the output detection photo diode 620, thus obtaining the intensity of light transmitting though the wavelength filter 700 and a ratio of reflecting light, and the wavelength of the laser beam can be obtained from the above ratio.

Meanwhile, the above embodiment has described an operation wherein the wavelength tunable selective filter 300 selects only one wavelength. If the wavelength tunable selective filter 300 is configured to be able to select a plurality of wavelengths, it is possible to manufacture a desired wavelength tunable laser apparatus.

The wavelength tunable selective filter 300 configured to select one wavelength, as mentioned above, may be manufactured in such a way to alternately grow a GaAs layer and an AlGaAs later on the GaAs substrate or may be manufactured by in turn depositing amorphous silicon and SiN on the substrate, for example, glass, quarts, silicon, etc.

On the other hand, the wavelength tunable selective filter configured to select a plurality of wavelengths is manufactured in a structure where a plurality of wavelengths can pass through the filter at regular frequency intervals. This structure can be easily manufactured using an etalon filter. The etalon filter may be manufactured in such a way to coat reflective either side of the transparent substrate with respect to the light with a predetermined wavelength band to transmit so as to provide a predetermined reflectivity.

Figure 15:
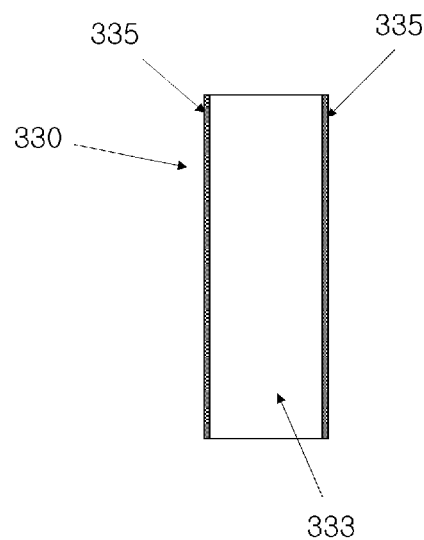
FIG. 15 is a view illustrating an example of a wavelength tunable selective filter formed of an etalon filter according to the present invention.

FIG. 15 is a view illustrating an example of a wavelength tunable selective filter formed of an etalon filter. The etalon filter forming the wavelength tunable selective filter 330 may be configured in a structure where a reflection film 335 is deposited on either side of the semiconductor substrate 333 through which a laser beam, for example, silicon, GaAs or InP transmit so as to provide a previously set reflectivity by using a dielectric thin film having different refractive indexes. The method for manufacturing a reflection film 335 using a dielectric thin film is a method which is widely being used to manufacture a lens coating and optical filter, which corresponds to a technology with a high maturity. This method is advantageous since it is simple in terms of manufacturing as compared with a method wherein a GaAs layer and an AlGaAs layer are alternately grown on the GaAs substrate or a method wherein an amorphous silicon and SiN are deposited on the substrate, for example, silicon, etc.

Figure 16:
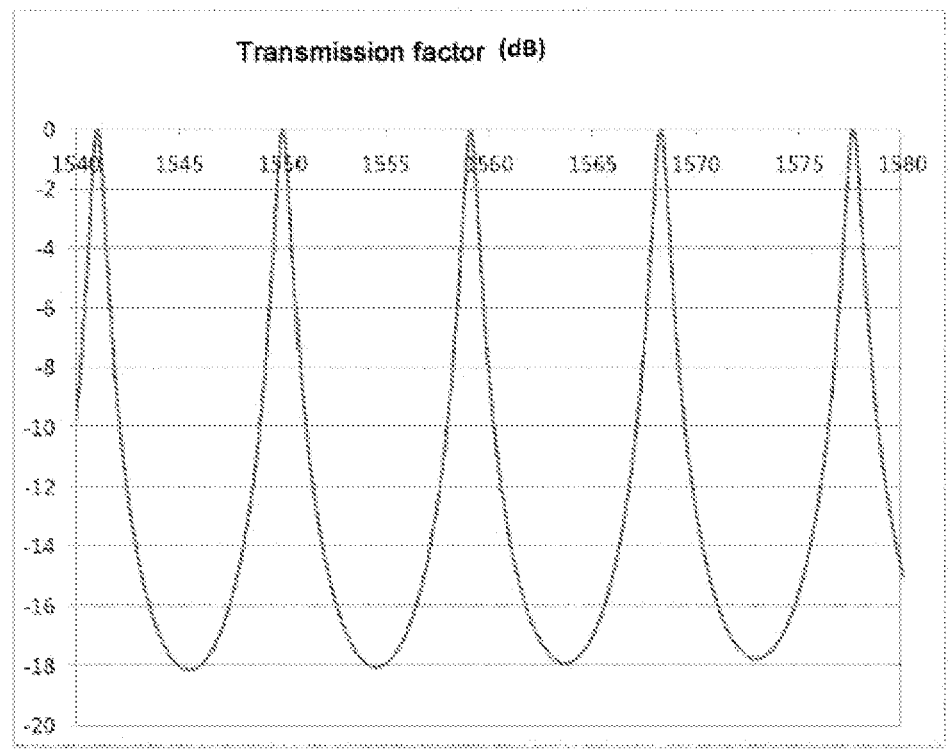
FIG. 16 is a view illustrating an example of transmission factor based on wavelength of light which transmits through an etalon filter manufactured by a method in FIG. 15.

FIG. 16 is a view illustrating a transmission factor based on the wavelength of light which transmits through the etalon filter manufactured by the method in FIG. 15. The etalon filter used to measure the transmission facto has a reflection film coated on either side of the silicon substrate having a thickness of 50 um with a dielectric thin film layer so as to have 70% of reflectivity on each surface. As in FIG. 16, the thusly constituted silicon etalon filter may have a plurality of transmission wavelength bands each having a wavelength interval of about 1000 GHz.

Figure 17:
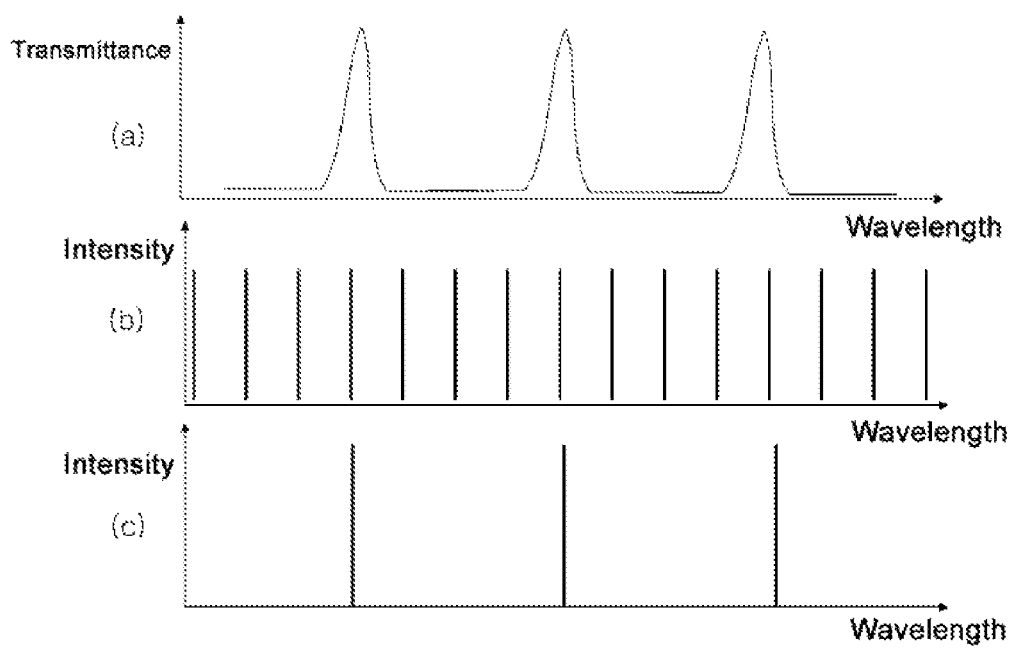
FIG. 17 is a view illustrating an oscillation laser wavelength in case where a wavelength tunable selective filter having a plurality of transmission wavelength bands is used for an external resonator type laser in FIG. 2.

FIG. 17 is a view illustrating an oscillation laser wavelength when a wavelength tunable selective filter applies, which has a plurality of transmission wavelength bands, to an external resonator type laser in FIG. 2.

As illustrated in FIG. 17B, the Fabry-Perot mode of an external resonator type is continuously arranged distributed at a wavelength interval of 0.1 nm~1 nm. The light which directly reflects off the wavelength tunable selective filter 330 at a predetermined slanted angle with respect to the optical axis inside the laser resonator does not feed back to the laser diode chip 100, but the light which transmits through the wavelength tunable selective filter 330 reflects off the light feedback reflection mirror 500 and transmits through the wavelength tunable selective filter 330 and feeds back to the laser diode chip 100. To this end, the laser diode chip 100 can have a wavelength locking and laser oscillation in the resonator Fabry-Perot mode of the wavelength band which transmits through the wavelength tunable selective filter 330. Here, as illustrated in FIG. 17A, if the light which transmits through the wavelength tunable selective filter 330 has a plurality of wavelength bands, the laser resonator as in FIG. 17C oscillates in the Fabry-Perot mode in the transmission wavelength band of each wavelength tunable selective filter 330, thus generating a laser beam which has a plurality of wavelengths.

The above mentioned different wavelengths may cause noise. For this reason, it may make unavailable the communication of the DWDM method which requires a very accurate control for wavelengths. So, if the wavelength tunable selective filter 330 having a plurality of transmission wavelength bands is used, a function may be necessary, which may allow only one wavelength to oscillate at the laser resonator.

This function can be implemented by changing the characteristics of the light feedback partial reflection mirror 500 as in FIGS. 2 and 6. In FIGS. 2 and 6, the description is given assuming that the light feedback partial reflection mirror 500 is formed of a partial reflection mirror which has a constant reflectivity irrespective of wavelength, but in order to manufacture a laser having a single wavelength by using the wavelength tunable selective filter 330 which has a plurality of transmission wavelength bands, the light feedback partial reflection mirror 500 should have a predetermined set specific reflectivity with respect to only a specific wavelength, and a complete transmission characteristic should be provided with respect to a wavelength band where oscillations should not take place.

Figure 18:
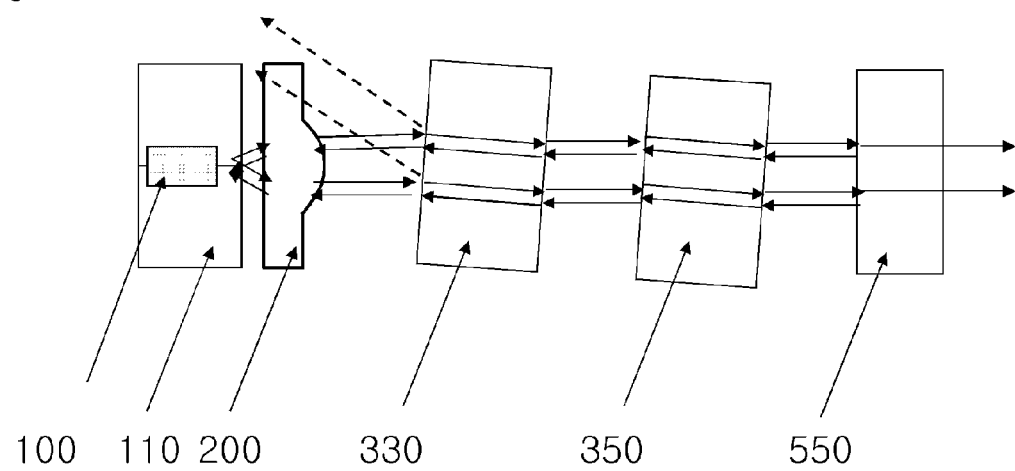
FIG. 18 is an installation conception view illustrating an external resonator type laser package to which a wavelength tunable selective filter having a plurality of transmission wavelength bands and a partial reflection mirror which reflects off only with respect to a specific wavelength have applied.
Figure 19:
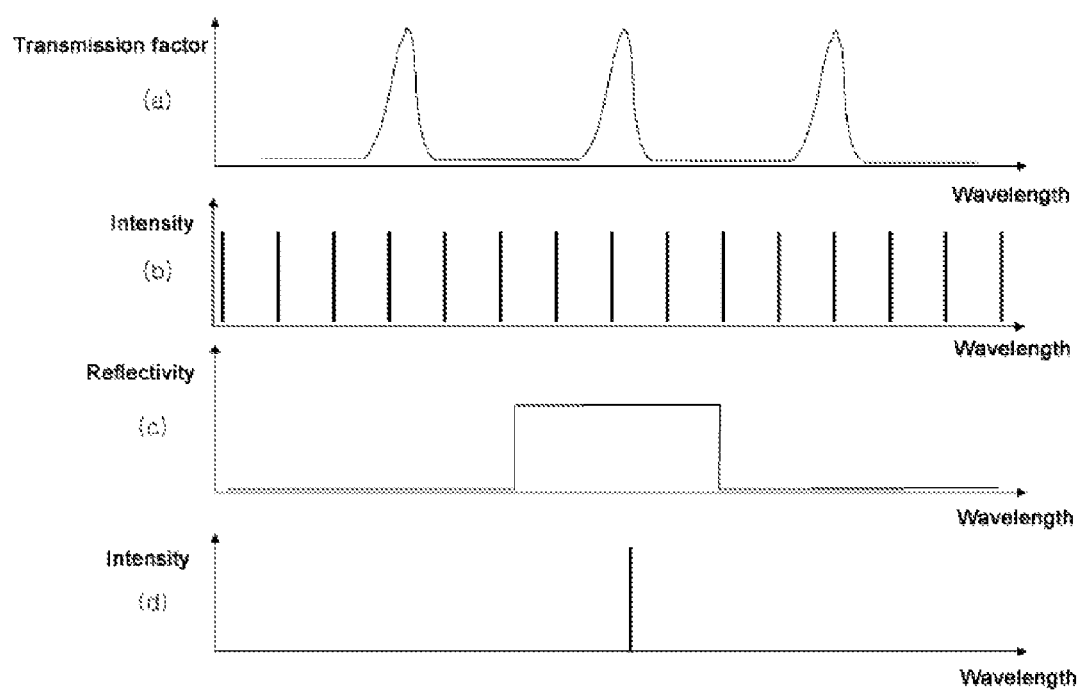
FIG. 19 is a conception view for describing a laser operation principle in an external resonator type laser structure in FIG. 18.

FIG. 18 is an installation conception view illustrating an external resonator type laser package to which a wavelength tunable selective filter having a plurality of transmission wavelength bands and a partial reflection mirror which reflects off only with respect to a specific wavelength have applied. FIG. 19 is a conception view for describing a laser operation principle in an external resonator type laser structure in FIG. 18.

As illustrated in FIGS. 18 and 19, the wavelength tunable selective filter 330 has a plurality of transmission wavelength bands, and the light feedback partial reflection mirror 550 has a characteristic of the wavelength-dependent light feedback partial reflection mirror wherein reflection occurs at a previously set ration with respect to a specific wavelength band, and it transmits with respect to other band of wavelength where the laser oscillation does not take place.

In the thusly constituted external resonator type laser structure, the laser diode chip 100 emits light which has a wide wavelength band matching with the gain characteristic of the semiconductor laser. The light emitting from the laser diode chip 100 reaches the wavelength tunable selective filer 330 having a plurality of transmission wavelength bands. In this light, a plurality of wavelength bands which pass through the wavelength tunable selective filter 330 transmit through the wavelength tunable selective filter 330 and is fed to the light feedback partial reflection mirror 550. On the other hand, the laser beam which reflects, not transmitting through the wavelength tunable selective filter 330 reflects off the wavelength tunable selective filter 330 which is distorted at a predetermined angle with respect to the optical axis of the laser and transmits along another route, so it does not feed back to the laser diode chip 100.

Figure 20:
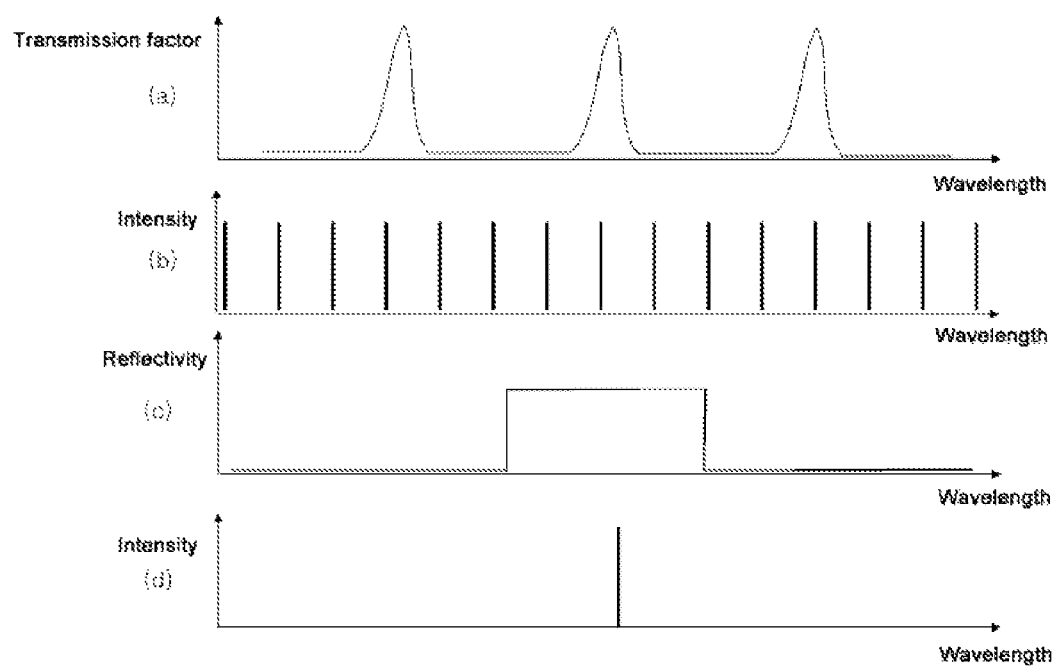
FIG. 20 is a conception view for describing a procedure wherein wavelengths can be varied in an external resonator type laser structure in FIG. 18.

Meanwhile, the light (corresponding to (a) in FIG. 20) of a plurality of wavelength bands that has passed through the wavelength tunable selective filter 330 transmits through the phase compensator 350 to the wavelength-dependent light feedback partial reflection mirror 550. The reflectivity characteristic curve of the wavelength-dependent light feedback partial reflection mirror 550 is shown in (c) in FIG. 20. This wavelength-dependent light feedback partial reflection mirror 550 is manufactured in such a way to partially reflect with respect to a specific wavelength in the multiple wavelengths which have passed through the wavelength tunable filter 330, thus providing transmission characteristics with respect to the remaining wavelengths. In the light emitting from the laser diode chip 100, the laser beam which did not pass through the wavelength tunable selective filter 330 reflects off the wavelength tunable filter 330, not feeding back to the laser diode chip 100, and the light with a plurality of wavelength bands passing through the wavelength tunable selective filter 330 reaches the wavelength-dependent light feedback partial reflection mirror 550 through the phase compensator 350.

In the light which has reached the wavelength-dependent light feedback partial reflection mirror 550 feeds back to the laser diode chip 100 through the phase compensator 350 and the wavelength tunable selective filter 330, and in the light which has reached the light feedback partial reflection mirror 550, the light of a wavelength corresponding to the transmission band transmits through the light feedback partial reflection mirror 550, so it does not feed back to the laser diode chip 10. To this end, the wavelength of the laser beam finally oscillating in the external resonator type laser structure in FIG. 18 becomes the Fabry-Perot mode (corresponding to (d) in FIG. 20) of the resonance mode of the wavelength band (corresponding to (c) in FIG. 20) wherein reflection occurs at the wavelength-dependent light feedback partial reflection mirror 550 in the light (corresponding to (a) in FIG. 20) which passes through the wavelength tunable selective filter 330 having a plurality of transmission wavelength bands as in FIG. 19.

In the wavelength-dependent light feedback partial reflection mirror 550 as in FIGS. 18 and 19, the reflectivity with respect to wavelengths except for reflection bands does not need to be non-reflective, and it should be below at least 80% as compared to the reflectivity of reflection bands, and more preferably, it may operate if the reflectivity is below 50%. Most preferably, the reflectivity of the transmission wavelength band of the partial reflection mirror 550 is below 25% as compared to the reflectivity of the reflection band. In addition, the reflection wavelength bandwidth of the partial reflection mirror 550 whose reflection characteristics vary based on the wavelength is preferably below ½ of the interval between wavelengths of the wavelength tunable selective filter 330.

In particular, the wavelength tunable selective filter 330 having a plurality of transmission wavelength bands as in FIGS. 18 and 19 may be preferably formed of an etalon filter which is manufactured in such a way that a reflection film is formed by depositing a plurality of dielectric thin films, which have high and low refractive indexes, on both surfaces of the semiconductor substrate, for example, silicon, GaAs or InP. In the etalon filter using such as a semiconductor substrate, the refractive index of the semiconductor substrate may change depending on temperature. The passing wavelength band can be changed in such a way to change the temperature of the etalon filter using the above characteristic, and it is possible to manufacture a wavelength tunable laser which is able to change the oscillating laser wavelength as in FIGS. 2 and 6. This method would have a high industrial applicability since a wavelength tunable filter can be manufactured through a well-established dielectric thin film deposition.

FIG. 20 is a view illustrating a procedure for varying a wavelength in an external resonator type laser structure as in FIGS. 18 and 19. As illustrated in FIG. 20A, in case of an etalon filter wherein a reflection film is formed with a dielectric thin film on both sides of the semiconductor substrate, for example, silicon, the refractive index of the semiconductor changes depending on the change in the temperature, whereupon the passing wavelength band can vary.

Since the Fabry-Perot mode (corresponding to (b) in FIG. 20) in the reflection band (corresponding to (c) in FIG. 20) of the light feedback partial reflection mirror 550 in the transmission band wavelengths of the changing wavelength tunable selective filter 30 can oscillate like in (d) in FIG. 20, whereupon the oscillation wavelengths of the laser can vary since the temperature of the wavelength tunable selective filter 330 having a plurality of transmission wavelength bands varies.

Figure 21:
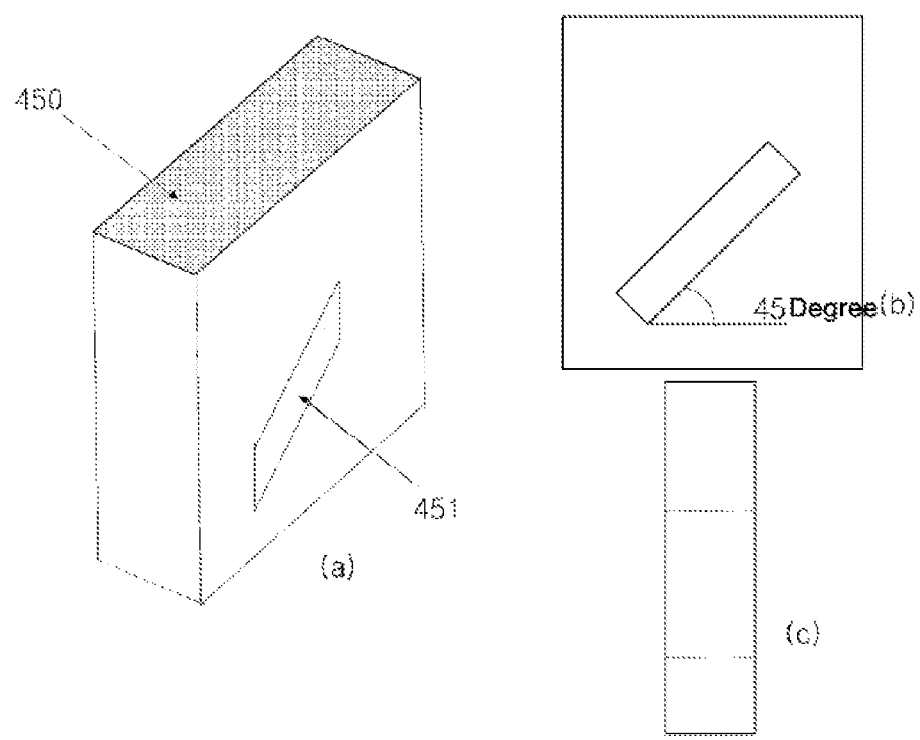
FIG. 21 is an installation concept view illustrating a stand used to fix a 45-degree reflection mirror according to the present invention.

FIG. 21 is a view illustrating a type of a 45-degree reflection mirror stand to easily mount a 45-degree reflection mirror on a TO type package according to the present invention.

As illustrated in FIG. 21, the 45-degree reflection mirror stand 450 according to the present invention is in a rectangular parallelepiped shape. The 45-degree reflection mirror stand 450 has a through hole with an angle of 45 degrees with respect to a lower side. The flat shaped 45-degree reflection mirror 400 is inserted into the through hole formed at the stand 450 and is mounted on a thermoelectric element. The partial reflection mirror is attached to the top of the stand 450. The thusly constituted stand 450 allows to easily attach the 45-degree reflection mirror 400 and the partial reflection mirror 500.

The stand 450 is preferably made of a material having a good heat transfer coefficient. This material may be a silicon substrate whose heat transfer coefficient is 170 W/m, wherein a through hole can be easily manufactured by a dry etching process. In particular, the silicon allows to easily adjust the width of the though hole by the dry etching method, and an angle adjustment with respect to the lower side is easy, so the assembling process can become easier since the flat type reflection mirror 400 is arranged at an angle of 45 degrees by inserting the flat type 45-degree reflection mirror 400 into the through hole of the silicon stand.

Meanwhile, if the expansion environment temperature of the TO type package changes variously, heat exchange may occur between the outer circumferential surface of the TO type package and the inner components of the TO type package. Since the distance between each inner component of the TO type package and an outer circumferential surface of the TO type package can change variously, the expansion environment temperature change of the TO type package may cause the temperature of the inner component of the TO type package to change non-uniformly. Since the independent temperature change of the resonator configuration material may cause a non-uniform change in an effective optical length of the resonator, it is preferred to minimize the heat exchange between the resonator configuration components and the outer circumferential surface of the TO type package. To this end, it is preferred to maintain vacuum the inside of the TO type package, and the vacuum degree is preferably below 0.2 atm.

As described above, the wavelength tunable laser apparatus according to the present invention may allow to maximize the use of the inner area of the TO type package in such a way to increase the length of the optical resonator while minimizing the horizontal direction length of the laser resonator by arranging the light feedback partial reflection mirror 500 onto the top of the 45-degree reflection mirror 500 which is installed in the horizontal direction of the laser diode chip 100. In addition, the semiconductor laser diode chip 100, the wavelength tunable selective filter 300 and the phase compensator 350 are arranged on one thermoelectric element 900, thus compensating for the whole effective refractive index change of the laser resonator due to the change in temperature of the thermoelectric element 900, whereby the Fabry-Perot mode determined by the laser resonator can be fixed to have a constant wavelength irrespective of the temperature of the thermoelectric element 900.

It is noted that the above present invention is not limited to the above embodiments, and it is obvious that a person having ordinary skill in the art to which the present invention pertains can modify and change variously within a technical concept of the present invention and an equivalent range of the claims below.

The invention claimed is:
1. A semiconductor laser apparatus, comprising:
a laser diode chip configured to emit a laser beam;
a light feedback partial reflection mirror configured to reflect part of the light emitting from the laser diode chip and feed back to the laser diode chip;
a collimation lens which is installed on a light route between the laser diode chip and the light feedback partial reflection mirror and is configured to collimate the light emitting from the laser diode chip;
a wavelength tunable selective filter wherein transmitting wavelengths change depending on temperature;
a phase compensator which is configured to compensate any change in a refractive index based on temperature of the semiconductor laser diode chip or the wavelength tunable elective filter wherein the refractive index changes depending on temperature; and
a 45-degree reflection mirror configured to convert the laser beam proceeding horizontally with respect to the bottom surface of the package into the direction of a laser beam proceeding vertically with respect to the bottom surface of the package,
wherein the laser diode chip, the wavelength tunable selective filter, and the phase compensator are arranged on the top of a thermoelectric element, whereupon the wavelengths oscillating based on the change in temperature of the thermoelectric element change.

2. The apparatus of claim 1, wherein the light feedback partial reflection mirrors are arranged on the top of the 45-degree reflection mirror.

3. The apparatus of claim 1, wherein the 45-degree reflection mirror is formed of a partial reflection mirror having a partial reflection/partial transmission characteristic, and a light detection photo diode is further arranged at one side of the 45-degree reflection mirror so as to detect the intensity of laser beam by receiving the laser beam of components which emit from the laser diode chip 100 and pass through the 45-degree reflection mirror.

4. The apparatus of claim 1, wherein the 45-degree reflection mirror is formed of a partial reflection mirror having a partial reflection/partial transmission characteristic, and a light detection photo diode is further arranged at one side of the 45-degree reflection mirror so as to detect the intensity of laser beam by receiving the laser beam of components which emit from the light feedback partial reflection mirror 500 and pass through the 45-degree reflection mirror.

5. The apparatus of claim 1, wherein the 45-degree reflection mirror is formed of a partial reflection mirror having a partial reflection/partial transmission characteristic, and at one side of the 45-degree reflection mirror, there are a wavelength filter and a photo diode on a light route of component which emits from the laser diode chip and transmits rough the 45-degree reflection mirror, wherein transmission factor changes depending on the wavelength, and at a lower side of the 45-reflection mirror, a photo diode is arranged on a light route of component which emits from the light feedback partial reflection mirror and transmits through the 45-degree reflection mirror, so a transmission factor of the wavelength filter and the wavelength of the laser beam can be obtained through a comparison of the photoelectric current flowing through the photo diode.

6. The apparatus of claim 1, wherein the wavelength tunable selective filter is manufactured on a GaAs substrate using a compound semiconductor of Ga(x1)Al(1−x1)As/Ga(x2)Al(1−x2)As and is configured to transmit a light of a predetermined wavelength, wherein a Ga composition is between 1 and 0.1.

7. The apparatus of claim 1, wherein the wavelength tunable selective filter is manufactured in such a way that an amorphous silicon (a-Si) and SiN (Silicon Nitride) are alternately deposited on a transparent substrate.

8. The apparatus of claim 1, wherein the wavelength tunable selective filter is formed of an etalon type filer having a plurality of transmission wavelength bands, and the light feedback partial reflection mirror has a predetermined set reflectivity at a wavelength band for oscillation, and the reflectivity at the remaining other wavelength band is below 80% as compared with the reflectivity of the oscillating wavelength band.

9. The apparatus of claim 8, wherein the reflectivity at the other wavelength band except for the wavelength band to oscillate with is below 25% as compared with the reflectivity of the oscillating wavelength band in the wavelength-dependent light feedback partial reflection mirror.

10. The apparatus of claim 1, wherein the wavelength tunable selective filter allows to form a reflection film in such a way that dielectric thin films with different refractive indexes are alternately deposited on both sides of a semiconductor substrate which includes any of silicon, GaAs and InP to provide a plurality of transmission wavelength bands.

11. The apparatus of claim 1, wherein the phase compensator is made of a polymer material containing any of PMMA, polyvinyl, polyethylene, polycarbonate, and epoxy.

12. The apparatus of claim 1, wherein the length of a laser resonator including the semiconductor laser diode chip, and the light feedback partial reflection mirror is 5.8 mm to 6.2 mm when calculating with an effective refractive index of 1.

13. A stand which is able to fix a flat plate shaped reflection mirror at an angle of 45° with respect to a horizontal direction, comprising:
a stand which is formed of a rectangular parallelepiped silicon substrate, wherein the silicon substrate includes a through hole having an angle of 45° with respect to any of sides, so a flat plate shaped reflection mirror is fixedly inserted into the through hole.

14. The apparatus of claim 13, wherein the through hole formed on the silicon substrate is formed by a dry etching method.

15. The apparatus of claim 8, wherein the wavelength tunable selective filter allows to form a reflection film in such a way that dielectric thin films with different refractive indexes are alternately deposited on both sides of a semiconductor substrate which includes any of silicon, GaAs and InP to provide a plurality of transmission wavelength bands.

* * * * *